United States Patent
Won et al.

(10) Patent No.: US 9,034,714 B2
(45) Date of Patent: May 19, 2015

(54) METHOD FOR FABRICATING SEMICONDUCTOR DEVICE

(71) Applicant: SAMSUNG ELECTRONICS CO., LTD., Suwon-si, Gyeonggi-do (KR)

(72) Inventors: Seok-Jun Won, Seoul (KR); Hyung-Suk Jung, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/011,095

(22) Filed: Aug. 27, 2013

(65) Prior Publication Data

US 2014/0073103 A1    Mar. 13, 2014

(30) Foreign Application Priority Data

Sep. 7, 2012 (KR) .................. 10-2012-0099382

(51) Int. Cl.
| | | |
|---|---|---|
| *H01L 21/336* | (2006.01) | |
| *H01L 29/66* | (2006.01) | |
| *H01L 21/8234* | (2006.01) | |
| *H01L 29/51* | (2006.01) | |
| *H01L 21/28* | (2006.01) | |
| *H01L 29/49* | (2006.01) | |

(52) U.S. Cl.
CPC .. *H01L 29/66545* (2013.01); *H01L 21/823462* (2013.01); *H01L 21/28088* (2013.01); *H01L 21/28202* (2013.01); *H01L 29/4966* (2013.01); *H01L 29/517* (2013.01); *H01L 29/518* (2013.01)

(58) Field of Classification Search
USPC .......................................... 438/216, 798, 976
See application file for complete search history.

(56) References Cited

U.S. PATENT DOCUMENTS

| | | | |
|---|---|---|---|
| 6,368,923 B1 | 4/2002 | Huang | |
| 7,138,691 B2 | 11/2006 | Burnham et al. | |
| 7,176,094 B2 | 2/2007 | Zhong et al. | |
| 7,217,611 B2 | 5/2007 | Kavalieros et al. | |
| 7,351,632 B2 * | 4/2008 | Visokay et al. | ............... 438/216 |
| 7,381,608 B2 | 6/2008 | Brask et al. | |
| 7,381,619 B2 | 6/2008 | Wang et al. | |
| 8,008,143 B2 | 8/2011 | Hsu et al. | |
| 8,110,490 B2 | 2/2012 | Yeh et al. | |

FOREIGN PATENT DOCUMENTS

| | | |
|---|---|---|
| JP | 2003-045995 | 2/2003 |
| JP | 2011-029296 | 2/2011 |
| KR | 10-2003-0059458 A | 7/2003 |
| KR | 10-2005-0051177 A | 6/2005 |
| KR | 10-2005-0069228 A | 7/2005 |
| KR | 10-2005-0118466 A | 12/2005 |

* cited by examiner

*Primary Examiner* — Chandra Chaudhari
(74) *Attorney, Agent, or Firm* — Lee & Morse, P.C.

(57) ABSTRACT

A method of fabricating a semiconductor device includes providing a dummy gate insulation film formed on a substrate, the dummy gate insulation film including a first material and providing a spacer formed at least one side of the gate insulation film, the spacer including the first material, removing the first material included in the dummy gate insulation film by a first process, removing the dummy gate insulation film from which the first material has been removed by a second process different from the first process, and sequentially forming a gate insulation film and a gate electrode structure on the substrate.

20 Claims, 12 Drawing Sheets

FIG. 20

METHOD FOR FABRICATING SEMICONDUCTOR DEVICE

CROSS-REFERENCE TO RELATED APPLICATION

Korean Patent Application No. 10-2012-0099382, filed on Sep. 7, 2012, in the Korean Intellectual Property Office, and entitled: "Method for Fabricating Semiconductor Device," is incorporated by reference herein in its entirety.

BACKGROUND

1. Field

Embodiments relate to a method of fabricating a semiconductor device.

2. Description of the Related Art

As the feature size of an MOS transistor is reduced, lengths of a gate and a channel formed thereunder decrease. Therefore, a variety of studies are being conducted to increase capacitance between the gate and the channel and to improve operating characteristics of the MOS transistor.

SUMMARY

Embodiments are directed to a method of fabricating a semiconductor device including providing a dummy gate insulation film formed on a substrate, the dummy gate insulation film including a first material and providing a spacer formed at least one side of the gate insulation film, the spacer including the first material, removing the first material included in the dummy gate insulation film by a first process, removing the dummy gate insulation film from which the first material has been removed by a second process different from the first process, and sequentially forming a gate insulation film and a gate electrode structure on the substrate.

The first material may include nitrogen.

The first process may include performing a plasma treatment on the dummy gate insulation film using a second material different from the first material.

The second material may include oxygen.

A bias voltage may be applied to the substrate while the first process is performed.

The first process may include dry-etching the dummy gate insulation film.

The second process may include forming a by-product by allowing third and fourth materials different from the first and second materials to be absorbed into the dummy gate insulation film from which the first material has been removed, and removing the formed by-product.

The second process may be repeatedly performed a multiple number of times.

Embodiments are also directed to a method of fabricating a semiconductor device including providing a substrate including a first region and a second region, forming a first gate insulation film including a first material and a second material and forming a spacer on at least one side of the first gate insulation film in the first region and the second region, respectively, performing a removal process to selectively remove the first gate insulation film formed in the first region, forming a second gate insulation film made of a different material from the first gate insulation film in the first region and the second region; and forming a gate electrode structure on the second gate insulation film. The removal process includes a first process that removes the first material included in the first gate insulation film formed in the first region, and a second process that removes the first gate insulation film from which the first material has been removed.

The method may further include forming a sacrificial film covering a top surface of the first gate insulation film formed in the second region while exposing a top surface of the first gate insulation film formed in the first region. The removal process may be performed using the sacrificial film as a mask.

The sacrificial film may include a silicon oxide film.

The spacer may include the first material. The first material may include nitrogen. The second material may include oxygen.

The first process may include removing the first material by injecting the second material into the first gate insulation film formed in the first region.

A dielectric constant of the second gate insulation film may be greater than that of the first gate insulation film.

The first region may include a low voltage region and the second region includes a high voltage region.

Embodiments are also directed to a method of fabricating a semiconductor device including providing a dummy gate insulation film on a substrate and providing a spacer on at least one side of the gate insulation film, the dummy gate insulation film including a first material that is nitridated, and the spacer including a second material that is nitridated, the first material and the second material being the same or different, removing nitrogen from the first material included in the dummy gate insulation film by a first process, removing the first material from which nitrogen has been removed by a second process different from the first process such that the dummy gate insulation film is removed from the substrate, and sequentially forming a gate insulation film and a gate electrode structure on the substrate.

Removing nitrogen from the first material included in the dummy gate insulation film by the first process may include performing a plasma treatment on the dummy gate insulation film using oxygen gas.

The dummy gate insulation film may extend horizontally on the substrate. The spacer may extend vertically from the substrate at the at least one side of the dummy gate insulation film. A bias voltage may be applied to the substrate while the first process is performed such that nitrogen is selectively removed from the dummy gate insulation film.

Removing nitrogen from the first material included in the dummy gate insulation film by the first process may include dry-etching the dummy gate insulation film using an etchant that reacts with nitrogen.

The second process may include forming a by-product by absorbing HF and $NH_3$ into the dummy gate insulation film from which nitrogen has been removed, and removing the formed by-product.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

A method of fabricating a semiconductor device according to an embodiment will be described with reference to FIGS. 1 to 7.

Figure 1:
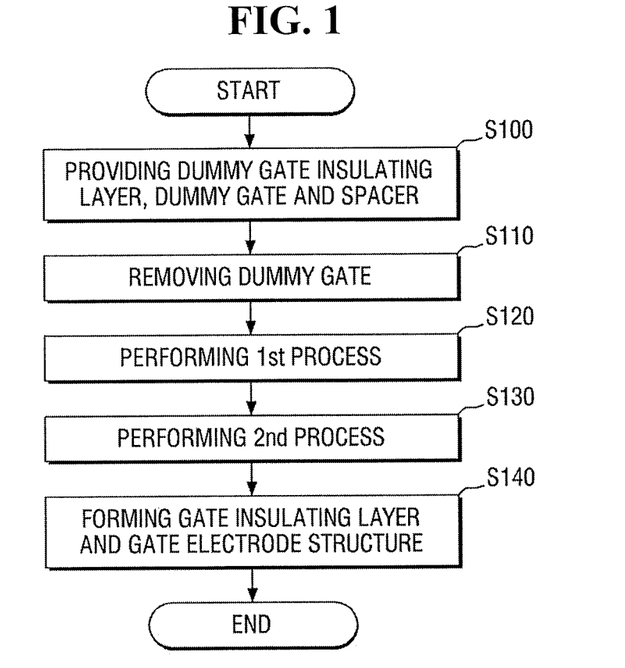
FIG. 1 illustrates a flowchart illustrating a method of fabricating a semiconductor device according to an embodiment.

FIG. 1 illustrates a flowchart depicting a method of fabricating a semiconductor device according to an embodiment and FIGS. 2 to 7 illustrate intermediate process stages in order to explain the method of fabricating a semiconductor device shown in FIG. 1.

Referring to FIG. 1, a dummy gate insulation film, a dummy gate and a spacer are provided (S100). Any suitable method of forming the dummy gate insulation film, the dummy gate and the spacer may be used, and an exemplary method thereof will now be described herein.

Figure 2:
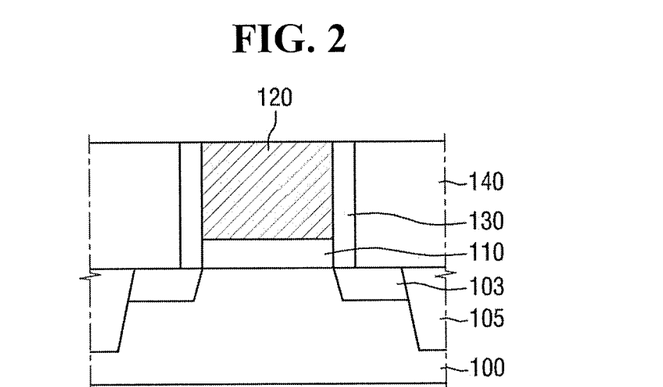
FIGS. 2 to 7 illustrate intermediate process stages in order to explain the method of fabricating a semiconductor device shown in FIG. 1.

Referring to FIG. 2, a dummy gate insulation film 110 and a dummy gate 120 are sequentially formed on a substrate 100.

The substrate 100 may be made of at least one semiconductor material selected from the group of Si, Ge, SiGe, GaP, GaAs, SiC, SiGeC, InAs and InP. In addition, in some implementations, the substrate 100 may include a silicon on insulator (SOI) substrate.

An isolation film 105 such as a shallow trench isolation (STI) film may be formed in the substrate 100.

The dummy gate insulation film 110 may be a film that is nitridated to increase its dielectric constant. In some embodiments, in order to increase the dielectric constant, the dummy gate insulation film 110 may be a silicon oxynitride film (SiON) formed by nitridating a silicon oxide film ($SiO_2$).

The dummy gate 120 may be made of, for example, polysilicon.

In such a manner, after the dummy gate insulation film 110 and the dummy gate 120 are sequentially formed on the substrate 100, the dummy gate insulation film 110 and the dummy gate 120 may be patterned. Subsequently, a spacer 130 may be formed along sidewalls of the patterned dummy gate insulation film 110 and dummy gate 120 from upper portions thereof.

In some embodiments, the dummy gate insulation film 110 and the spacer 130 may include the same material or may both have a common first element such as, for example, nitrogen. For example, the dummy gate insulation film 110 may include silicon oxynitride (SiON) and the spacer 130 may include silicon nitride (SiN) or silicon oxynitride (SiON).

FIG. 2 shows that the spacer 130 may be shaped as a bar. In other implementations, the spacer 130 may have other shapes, such as an L shape.

After the spacer 130 is formed in the above-stated manner, an impurity may be injected into the substrate 100, thereby forming a source/drain 103. For example, the impurity may be injected by ion implantation.

An interlayer dielectric film 140 may be formed on the substrate 100. The interlayer dielectric film 140 may be formed to cover the spacer 130 formed on the dummy gate 120. Thereafter, the interlayer dielectric film 140 formed on the dummy gate 120 may be planarized until a top portion of the dummy gate 120 is exposed, thereby completing the dummy gate insulation film 110, the dummy gate 120 and the spacer 130, as shown in FIG. 2.

Next, referring again to FIG. 1, the dummy gate 120 is removed (S110).

Figure 3:
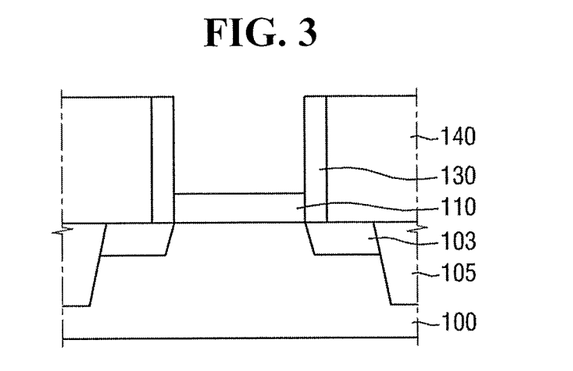

Referring to FIG. 3, the dummy gate 120 formed on the dummy gate insulation film 110 may be removed by wet etching. During the etching process to remove the dummy gate 120, an etchant having etching selectivity to the spacer 130 and the dummy gate insulation film 110 may be used. For example, when the dummy gate 120 is made of polysilicon, the spacer 130 is formed of silicon nitride (SiN), and the dummy gate insulation film 110 is formed of silicon oxynitride (SiON), the etching process may include a first etching process in which etching is performed for about 2 to 8 seconds using HF as an etchant, and a second process in which etching is performed for about 100 to 150 seconds using $NH_4OH$ as an etchant.

Next, referring to FIG. 1, a first process is performed (S120) to remove the material commonly included in the dummy gate insulation film (110 of FIG. 3) and the spacer 130. For example, a technique to increase the dielectric constant of the dummy gate insulation film (110 of FIG. 3) may include nitridating the dummy gate insulation film (110 of FIG. 3). However, in some manufacturing processes of a semiconductor device (for example, a transistor), the spacer 130 formed at either side of the dummy gate insulation film (110 of FIG. 3) may be formed of a nitride film, like the dummy gate insulation film (110 of FIG. 3). If the dummy gate insulation film (110 of FIG. 3) and the spacer 130 commonly include nitrogen, the following issues may arise.

When an etchant to remove the nitridated dummy gate insulation film (110 of FIG. 3) is used, the nitridated spacer 130 may also be damaged. To avoid this, the dummy gate insulation film (110 of FIG. 3) may be removed using an etchant that does not cause damage to the nitridated spacer 130. In this case, however, the dummy gate insulation film (110 of FIG. 3) may not be properly removed.

Therefore, according to embodiments, the removal process of the dummy gate insulation film (110 of FIG. 3) may be separately performed through the first process to selectively remove nitrogen included in the dummy gate insulation film (110 of FIG. 3) and the second process to remove the nitrogen-removed dummy gate insulation film (111 of FIG. 4), thereby completely removing the dummy gate insulation film (110 of FIG. 3) without causing damage to the spacer 130.

An example of the first process to selectively remove nitrogen included in the dummy gate insulation film (110 of FIG. 3) may be an oxygen ($O_2$) plasma process. The dummy gate insulation film (110 of FIG. 3) may be plasma-treated using a plasma gas including oxygen ($O_2$), thereby first selectively removing nitrogen included in the dummy gate insulation film (110 of FIG. 3). The oxygen ($O_2$) included in the plasma gas may be injected into the dummy gate insulation film (110 of FIG. 3) to replace nitrogen in the dummy gate insulation film. Accordingly, the nitrogen included in the dummy gate insulation film (110 of FIG. 3) may be selectively removed, thereby forming the nitrogen-removed dummy gate insulation film (111 of FIG. 4).

Figure 4:
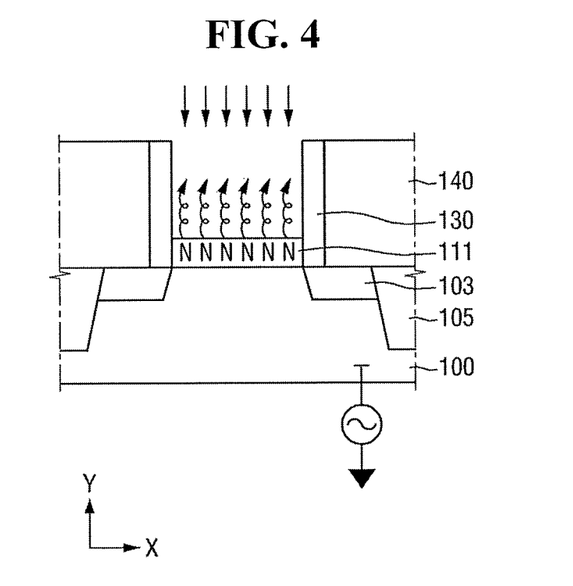

The plasma gas including oxygen ($O_2$) may serve to remove nitrogen. Accordingly, there is a possibility that the nitrogen included in the spacer 130 could also be affected by the plasma gas. Therefore, in this embodiment, while the oxygen ($O_2$) plasma process is performed, an electrical bias 160 may be applied to the substrate 100, as shown in FIG. 4, thereby causing the plasma gas to react in a direction perpendicular to the substrate 100 (for example, in the Y-axis direction). If the bias 160 is applied to the substrate 100 in such a manner, the nitrogen removal reaction is less likely to take place in the spacer 130, which is formed in a relatively horizontal direction from the top surface of the substrate 100 (for example, in the X-axis direction).

In some implementations, in order to increase the efficiency of the plasma treatment, the plasma gas may further include chlorine (Cl) or argon (Ar), as examples, in addition to oxygen ($O_2$).

Next, referring to FIG. 1, the second process may be performed (S130) to remove the nitrogen-removed dummy gate insulation film.

Figure 5:
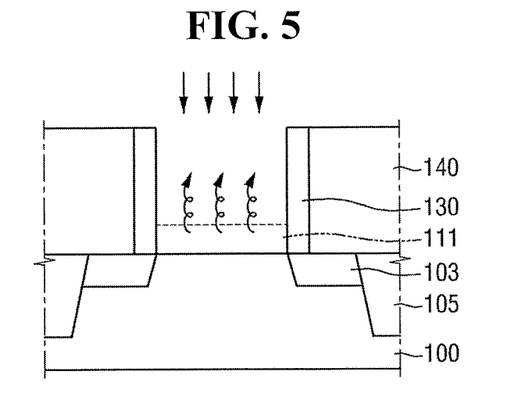

Referring to FIG. 5, as an example, a chemical oxide removal (COR) process may be used to remove the nitrogen-removed dummy gate insulation film 111. The second process may include a first sub-process of forming a by-product by allowing HF and $NH_3$ to be absorbed into the dummy gate insulation film 111 from which the first material, such as nitrogen, has been removed, and a second sub-process of removing the formed by-product using heat or water. In some implementations, the first sub-process and the second sub-process may be repeatedly performed a multiple number of times until the nitrogen-removed dummy gate insulation film 111 without nitrogen is removed.

If the dummy gate insulation film 111 is removed in such a manner, the top surface of the substrate 100 may be exposed, as shown. In other implementations, if a functional film (not shown) exists under the dummy gate insulation film 111, a top surface of the functional film may be exposed.

Next, referring to FIG. 1, a gate insulation film and a gate electrode structure may be formed (S140).

Figure 6:
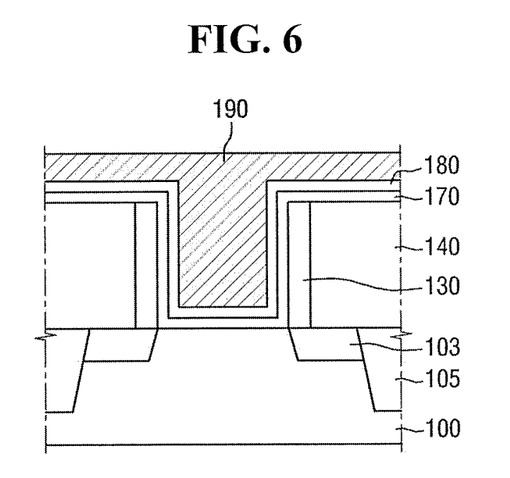

Referring first to FIG. 6, the gate insulation film 170, a work function regulating film 180, and a gate electrode structure 190 may be sequentially formed at a location from which the nitrogen-removed dummy gate insulation film (111 of FIG. 5) has been removed.

Although not shown, an interface film (not shown) may be formed under the gate insulation film 170 to prevent an interfacing failure from occurring between the substrate 100 and the gate insulation film 170. The interface film (not shown) may include a low dielectric material layer having a dielectric constant (k) of 9 or less. For example, the interface film may be a silicon oxide film (having a dielectric constant (k) of approximately 4) or a silicon oxynitride film (having a dielectric constant (k) of approximately 4 to 8 according to amounts of oxygen atoms and nitrogen atoms). In other implementations, the interface film (not shown) may be made of silicate, or a combination of the films disclosed above.

The gate insulation film 170 may include a high dielectric material layer. In some implementations, the gate insulating film 170 may include a material selected from the group of $HfO_2$, $Al_2O_3$, $ZrO_2$, and $TaO_2$, as examples.

The work function regulating film 180 may be formed to regulate a threshold voltage (Vt) of a semiconductor device (for example, a transistor). If the semiconductor device (for example, a transistor) has, for example, N-type conductivity, the work function regulating film 180 may be an N-type work function regulating film. The N-type work function regulating film may include, for example, TiAl, TiAlN, TaC, TaAlN, TiC, or HfSi.

If the semiconductor device (for example, a transistor) has, for example, P-type conductivity, the work function regulating film 180 may be a P-type work function regulating film. The P-type work function regulating film may include, for example, TiN.

In some implementations, the work function regulating film 180 may be a combination of the work function regulating films illustrated above. The work function regulating film 180 may have a double-layered structure including an underlying P-type work function regulating film and an overlying N-type work function regulating film.

The gate electrode structure 190 may have a multi-layered structure including a conductive metal material, such as Al, W or a combination thereof, as examples.

Figure 7:
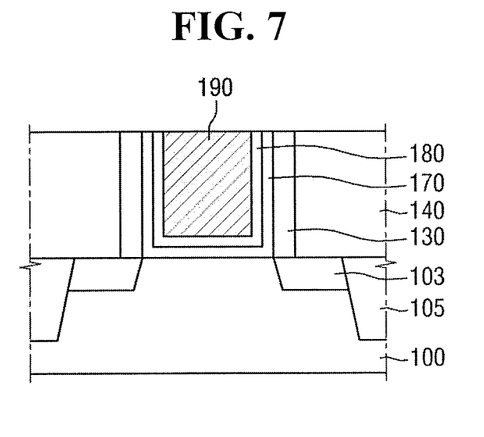

Referring to FIG. 7, the gate electrode structure 190, the work function regulating film 180, and the gate insulation film 170 may be planarized until a top portion of the interlayer dielectric film 140 is exposed. Accordingly, the work function regulating film 180 and the gate insulation film 170 may be formed to upwardly extend along sidewalls of the spacer 170, as shown.

The first and second processes according to the present embodiment have been described with respect to an oxygen ($O_2$) plasma process and a chemical oxide removal (COR) process, as examples. In other implementations, a dry etching process may be used as the first process and a wet etching process may be used as the second process.

In view of characteristics of the nitrogen included in the dummy gate insulation film (110 of FIG. 3), the nitrogen may exist around a surface of the dummy gate insulation film (110 of FIG. 3) in a relatively large amount. Therefore, in the first process according to the present embodiment, an area around the surface of the dummy gate insulation film (110 of FIG. 3) may be dry etched using an etchant reacting with nitrogen and generating a by-product, thereby selectively removing the nitrogen included in the dummy gate insulation film (110 of FIG. 3). In this case, in order to maximally prevent the spacer 130 adjacent to the dummy gate insulation film (110 of FIG. 3) from being damaged, a electrical bias (160 of FIG. 4) may be applied to the substrate 100.

Subsequently, the by-product formed in the first process may be removed in the second process. Then, as shown in FIG. 5, the dummy gate insulation film 111 may be removed.

Next, a method of fabricating a semiconductor device according to another embodiment will be described with reference to FIGS. 8 to 15.

Figure 8:
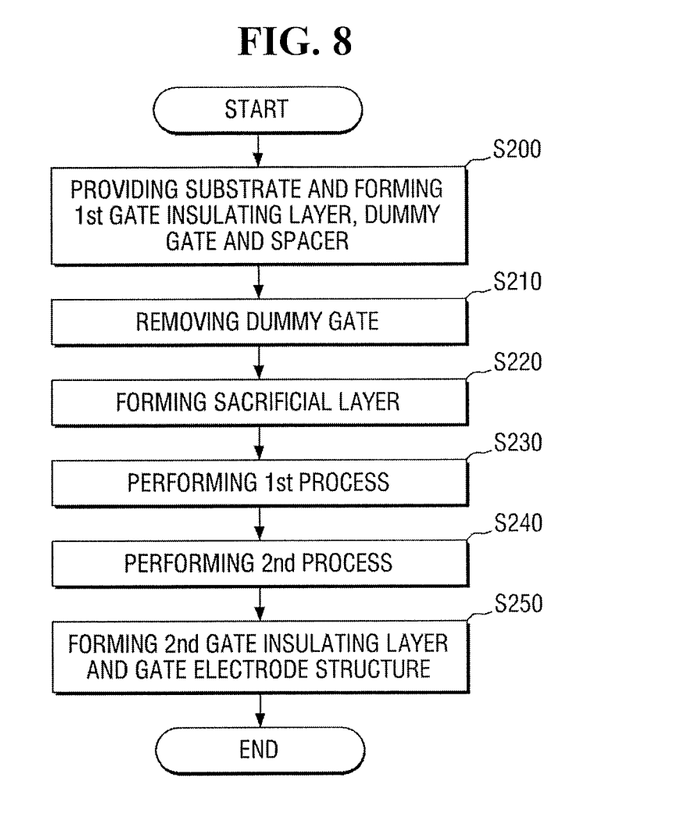
FIG. 8 illustrates a flowchart illustrating a method of fabricating a semiconductor device according to another embodiment.

FIG. 8 illustrates a flowchart depicting a method of fabricating a semiconductor device according to another embodiment, and FIGS. 9 to 15 illustrate intermediate process stages in order to explain the method of fabricating a semiconductor device shown in FIG. 8.

Referring to FIG. 8, a substrate including a first region and a second region is provided, and a first gate insulation film, a dummy gate and a spacer are provided (S200). Any suitable method of forming the first gate insulation film, the dummy gate and the spacer may be used. An exemplary method thereof will now be described herein.

Figure 9:
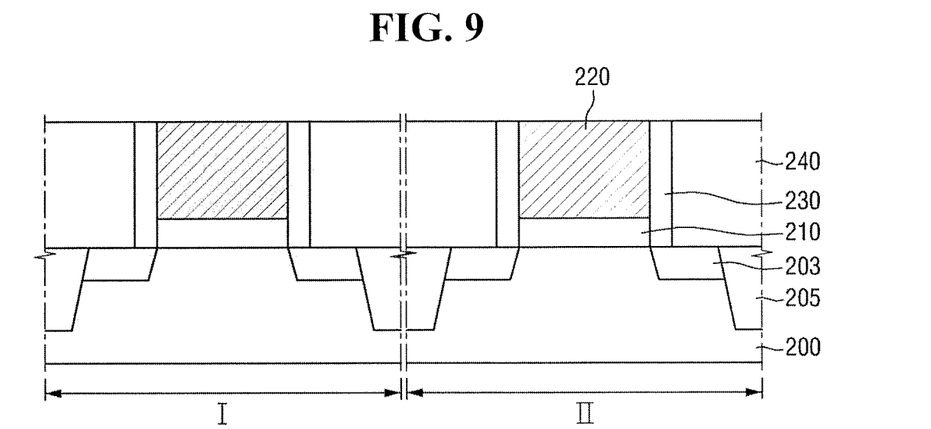
FIGS. 9 to 15 illustrate intermediate process stages in order to explain the method of fabricating a semiconductor device shown in FIG. 8.

In detail, referring to FIG. 9, a substrate 100 including a first region (I) and second region (II) may be provided. The first region (I) may be a region where a low voltage device driven with a low voltage is formed, and the second region (II) may be a region where a high voltage device driven with a high voltage is formed.

The first gate insulation film 210 and the dummy gate 220 may be sequentially formed on the substrate 200. Subsequently, the dummy gate insulation film 210 and the dummy gate 220 may be patterned. A spacer 230 may be formed along sidewalls of the patterned first gate insulation film 210 and dummy gate 220 from upper portions thereof.

The first gate insulation film 210, the dummy gate 220 and the spacer 230 may be substantially the same as corresponding ones of the previous embodiment. Accordingly, detailed descriptions thereof will not be repeated.

After the spacer 230 is formed in such a manner, an impurity may be injected into the substrate 200, thereby forming a source/drain 203. Subsequently, an interlayer dielectric film 240 may be formed on substrate 200. The interlayer dielectric film 240 may be formed to cover the spacer 230 formed on the dummy gate 220. Thereafter, the interlayer dielectric film 240 formed on the dummy gate 220 may be planarized until a top portion of the dummy gate 220 is exposed, thereby completing the first gate insulation film 210, the dummy gate 220 and the spacer 230, as shown in FIG. 9.

Referring again to FIG. 8, the dummy gate 220 may be removed (S210).

Figure 10:
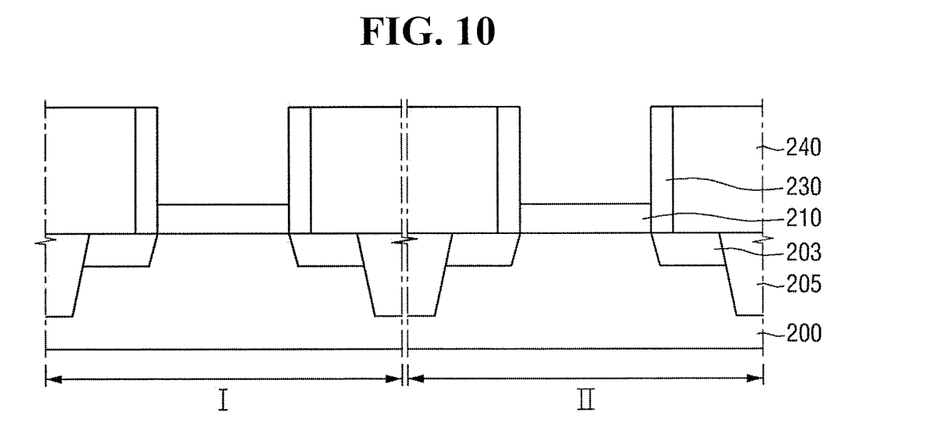

Referring to FIG. 10, the dummy gate 220 formed on the first gate insulation film 210 may be removed by wet etching. During the etching process to remove the dummy gate 220, an etchant having etching selectivity to the spacer 230 and the first gate insulation film 210 may be used. For example, when the dummy gate 220 is made of polysilicon, the spacer 230 is formed of silicon nitride (SiN), and the first gate insulation film 210 is formed of silicon oxynitride (SiON), the etching process may include a first etching process in which etching is performed for about 2 to 8 seconds using HF as an etchant, and a second process in which etching is performed for about 100 to 150 seconds using $NH_4OH$ as an etchant.

Next, referring to FIG. 8, a sacrificial film may be formed (S220).

Figure 11:
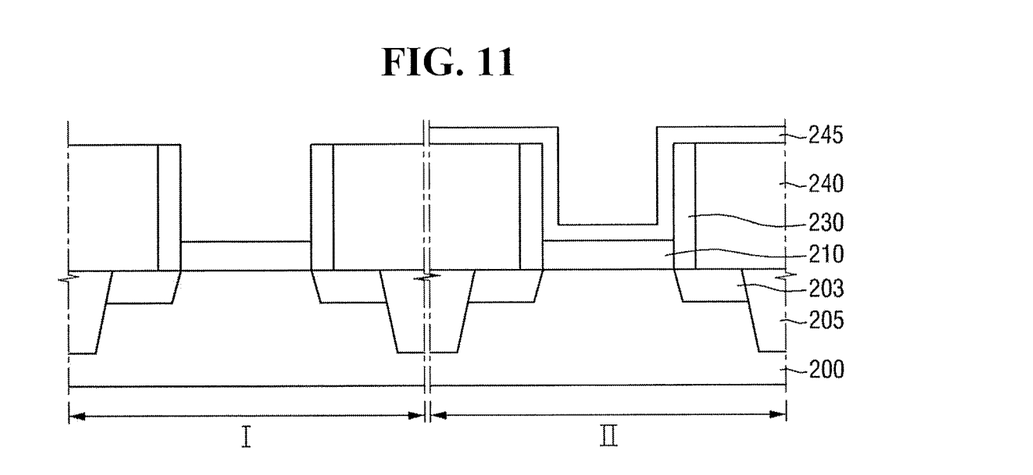

Referring to FIG. 11, the sacrificial film 245 may be formed only in the second region (II) of the substrate 200. A suitable method of forming the sacrificial film 245 only in the second region (II) of the substrate 200 may be used. An exemplary method thereof will now be described herein.

The sacrificial film 245 may be formed throughout the first and second regions (I) and (II) of the substrate 200. The sacrificial film 245 may be, for example, an oxide film. For example, the sacrificial film 245 may be a silicon oxide film ($SiO_2$).

After the sacrificial film 245 is formed throughout the first and second regions (I) and (II) of the substrate 200, a photoresist pattern (not shown) may be selectively formed only in the second region (II) of the substrate 200. The sacrificial film 245 formed in the first region (I) may be etched using the formed photoresist pattern (not shown) as a mask. After the etching is completed, the sacrificial film 245 that is selectively present only in the second region (II) of the substrate 200 may be formed, as shown.

Next, referring to FIG. 8, the first process may be performed (S230).

Figure 12:
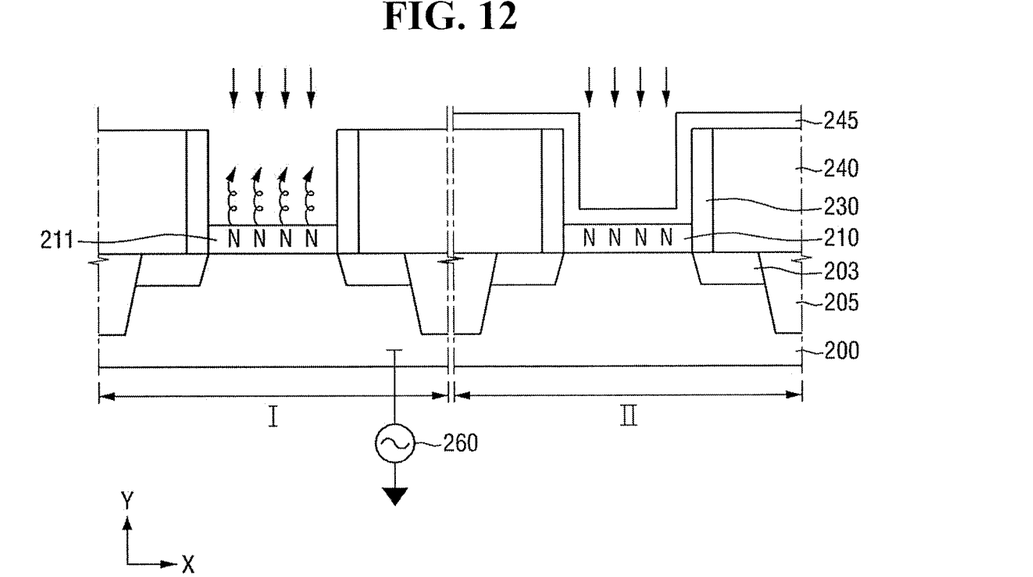

Referring to FIG. 12, the first process may be one of the above-described first processes. In some implementations, the first process may include performing an oxygen ($O_2$) plasma treatment on the first gate insulation film 210 using a plasma gas including oxygen ($O_2$). The sacrificial film 245 may be formed in the second region (II) of the substrate 200. Accordingly, the first gate insulation film 210 formed in the second region (II) of the substrate 200 does not react with the plasma gas, while only the first gate insulation film (210 of FIG. 11) formed in the first region (I) of the substrate 200 reacts with the plasma gas, thereby forming a first gate insulation film 211 from which nitrogen has been removed. In this embodiment, as the result of plasma treatment, the nitrogen-removed first gate insulation film 211 may exist in the first region (I) of the substrate 200, while the first gate insulation film 210 still including nitrogen may exist in the second region (II) of the substrate 200.

As shown in FIG. 12, an electrical bias 260 may be applied to the substrate 200, thereby causing the plasma gas to react in a direction perpendicular to the substrate 200 (for example, in the Y-axis direction). If the bias 260 is applied to the substrate 200 in such a manner, the nitrogen removal reaction is less likely to take place in the spacer 230, which is formed in a relatively horizontal direction from the top surface of the substrate 200 (for example, in the X-axis direction).

In other implementations, the first process may be performed using a dry etching process. If the substrate 200 is dry etched using an etchant reacting with nitrogen and generating a by-product, the first gate insulation film (210 of FIG. 11) formed in the first region (I) of the substrate 200 may react with the etchant and generate a by-product. On the other hand, the first gate insulation film 210 formed in the second region (II) of the substrate 200 may be blocked by the sacrificial film 245 so as to not react with the etchant, so that a by-product is not generated in the second region (II).

Next, referring to FIG. 8, the second process may be performed (S240).

Figure 13:
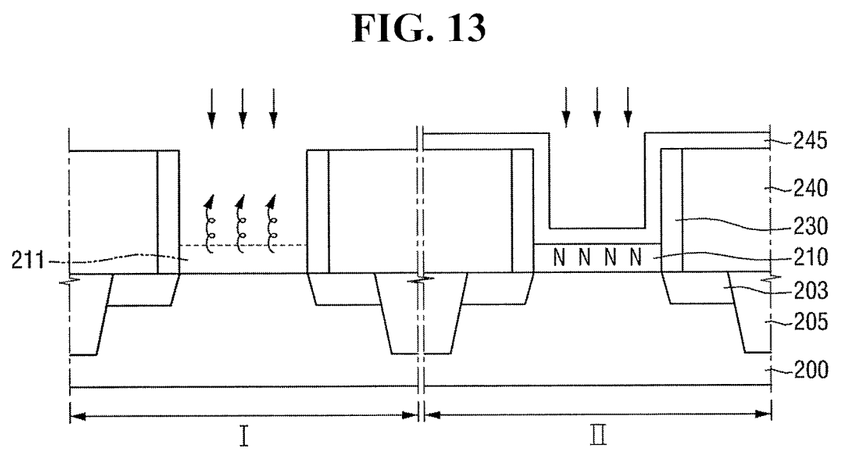

In detail, referring to FIG. 13, the second process may also be one of the above-described second processes.

A chemical oxide removal (COR) or a wet etching process, for example, may be used as the second process.

In a case where the COR is used as the second process, a first sub-process of forming a by-product by allowing HF and $NH_3$ to be absorbed into the nitrogen-removed first gate insulation film 211 from which the first material has been removed, and a second sub-process of removing the formed by-product using heat or water, may be performed, thereby removing the nitrogen-removed first gate insulation film 211 formed in the first region (I) of the substrate 200.

In a case where the wet etching is used as the second process, an etching to remove the by-product formed in the first process may be used, thereby forming the nitrogen-removed first gate insulation film 211 formed in the first region (I) of the substrate 200.

Detailed explanations of the processes are substantially the same as those described above, and a detailed description thereof will not be repeated.

Next, referring to FIG. 8, a second gate insulation film and a gate electrode structure may be formed (S250).

Referring to FIG. 11, the sacrificial film (245 of FIG. 13) may be removed. A dry etching process or a wet etching process may be used in removing the sacrificial film (245 of FIG. 13).

Figure 14:
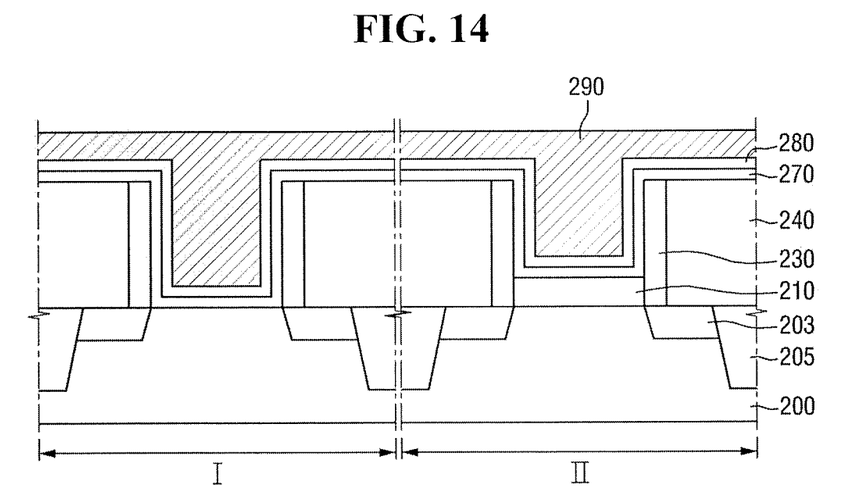

A second gate insulation film 270, work function regulating film 280, and a gate electrode structure 290 may be sequentially formed on the substrate 200. The first gate insulation film 210 will not have been removed from the second region (II) of the substrate 200. Accordingly, the second gate insulation film 270 may be formed on the first gate insulation film 210, as shown in FIG. 14.

A dielectric constant of the second gate insulation film 270 may be greater than that of the first gate insulation film 210. For example, the first gate insulation film 210 may be a silicon oxynitride film (SiON), and the second gate insulation film 270 may be formed of a material selected from the group of $HfO_2$, $Al_2O_3$, $ZrO_2$, and $TaO_2$.

The work function regulating film 280 and the gate electrode structure 290 have been fully described above, and detailed descriptions thereof will not be repeated.

Figure 15:
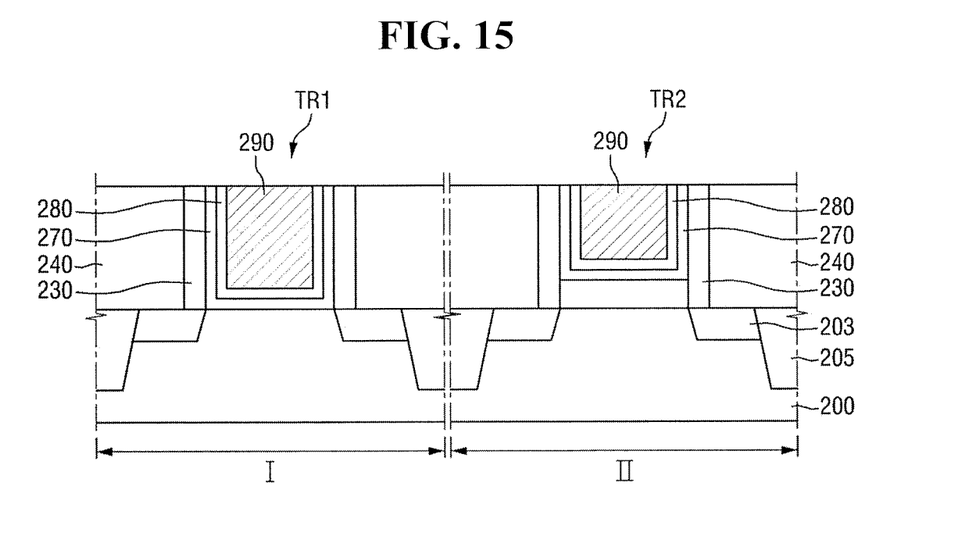

Referring to FIG. 15, the gate electrode structure 290, the work function regulating film 280, and the second gate insulation film 270 may be planarized until a top portion of the interlayer dielectric film 240 is exposed. Accordingly, a low-voltage transistor TR1 driven with a low voltage may be formed in the first region (I) of the substrate 200, and a high-voltage transistor TR2 driven with a high voltage may be formed in the second region (II) of the substrate 200. The work function regulating film 280 and the gate insulation film 270 may be foamed to extend upwardly along sidewalls of the spacer 270, as shown. The low-voltage transistor TR1 may include only the second gate insulation film 270 made of a material such as $HfO_2$, $Al_2O_3$, $ZrO_2$, or $TaO_2$, and the high-voltage transistor TR2 may include both the first gate insulation film 230 made of silicon oxynitride (SiON) and the second gate insulation film 270 made of a material such as $HfO_2$, $Al_2O_3$, $ZrO_2$, or $TaO_2$.

Figure 16:
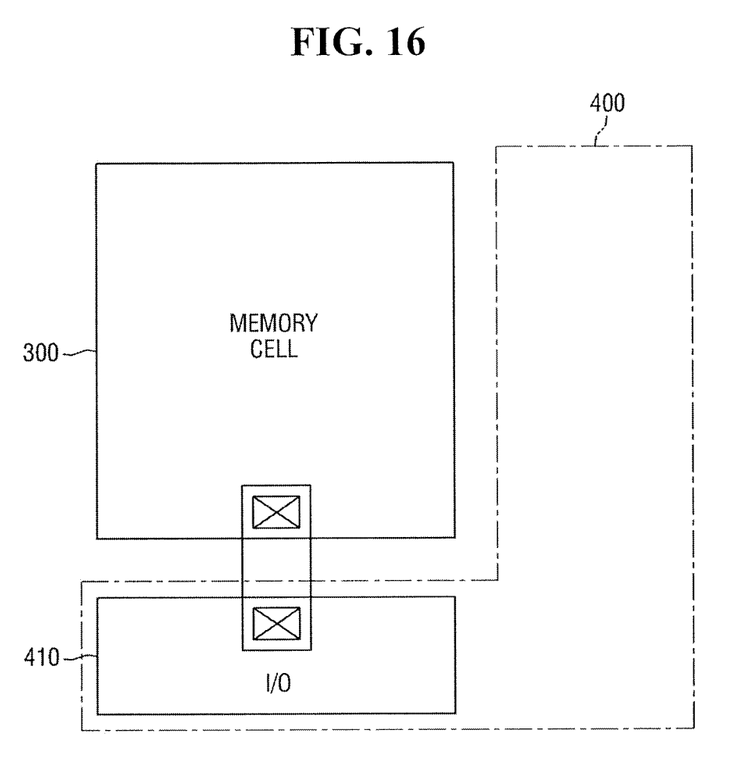
FIGS. 16 and 17 illustrate exemplary semiconductor devices fabricated according to embodiments.
Figure 17:
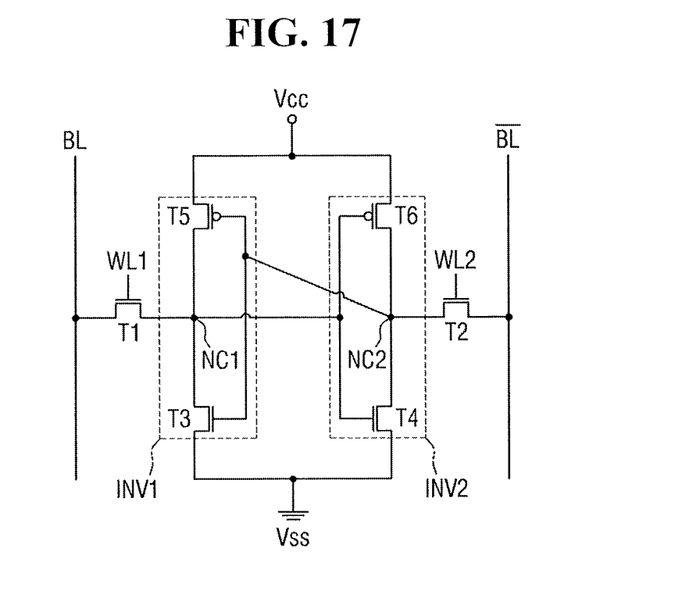

FIGS. 16 and 17 illustrate exemplary semiconductor devices fabricated according to embodiments.

Referring to FIG. 16, the semiconductor device may include a memory region 300 and a peripheral region 400. The memory region 300 may be, for example, a region where a memory device is formed, and the peripheral region 400 may be, for example, a region where a peripheral circuit device is formed.

In some embodiments, a static random access memory (SRAM) device shown in FIG. 17 may be formed in the memory region 300, as an example. Types of memory devices formed in the memory region 300 may be modified in various manners.

Referring to FIG. 17, the memory device may include a pair of inverters INV1 and INV2 connected in parallel between a power supply node Vcc and a ground node Vss, and a first transfer transistor T1 and a second transfer transistor T2 connected to output nodes of the respective inverters INV1 and INV2. The first transfer transistor T1 and the second transfer transistor T2 may be connected to a bit line BL and a complementary bit line BL/, respectively. Gates of the first transfer transistor T1 and the second transfer transistor T2 may be connected to word lines WL1 and WL2, respectively.

The first inverter INV1 may include a first load transistor T5 and a first driving transistor T3 connected in series, and the second inverter INV2 may include a second load transistor T6 and a second driving transistor T4 connected in series. In addition, in order to constitute a latch circuit by the first inverter INV1 and the second inverter INV2, an input node of the first inverter INV1 may be connected to an output node (NC2) of the second inverter INV2, and an input node of the second inverter INV2 may be connected to an output node (NC1) of the first inverter INV1).

At least one of the first and second transfer transistors T1 and T2, the first and second driving transistors T3 and T4, the first and second load transistors T5 and T6 may be the first transistor (TR1 of FIG. 15).

The peripheral region 400 may have a lower density than the memory region 300 and a distance between each of elements formed therein may be relatively large.

In some embodiments, the peripheral region 400 may include, for example, input/output (I/O) region 410. A plurality of transistors driven with a high voltage may be formed in the I/O region 410. For example, the second transistor (TR2 of FIG. 15) may also be formed in the I/O region 410.

Figure 18:
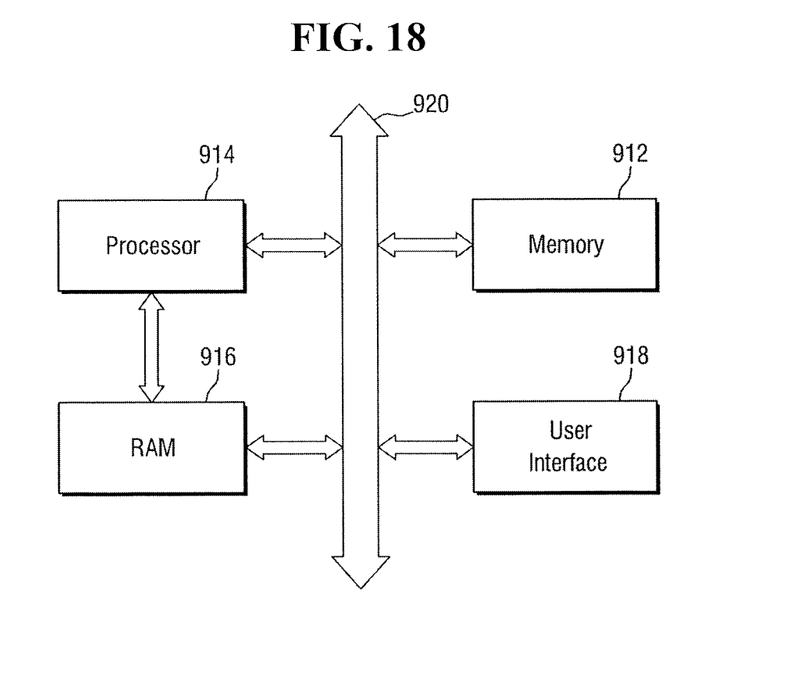
FIG. 18 illustrates a block diagram of an electronic system to which the semiconductor device fabricated according to embodiments is applied.

FIG. 18 illustrates a block diagram of an electronic system to which the semiconductor device fabricated according to embodiments is applied.

Referring to FIG. 18, the electronic system may include a memory system 912, a processor 914, a random access memory (RAM) 916, and a user interface 918. Examples of the electronic system may include a mobile equipment or a computer.

The memory system 912, the processor 914, the random access memory (RAM) 916, and the user interface 918 may perform data communication through a bus 920. The processor 914 may execute a program and control the electronic system. The RAM 916 may be used as the operating memory of the processor 914.

For example, each of the processor 914, the RAM 916 and the user interface 918 may include a semiconductor device according to embodiments. In some embodiments, the processor 914 and the RAM 916 may be incorporated into a single package.

The user interface 918 may be used to input/output data to/from the electronic system. The memory system 912 may store codes to operate the processor 914, data processed by the processor 914 or externally input data. The memory system 912 may include a controller and a memory.

The transistors according to embodiments may be provided into the memory system 912 or may be provided as part of the processor 914 or the user interface 918.

The electronic system may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 19:
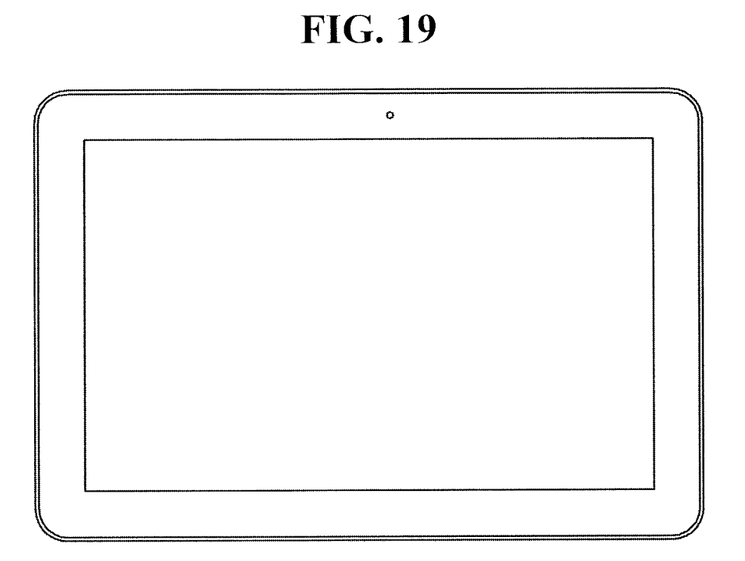
FIGS. 19 and 20 illustrate exemplary semiconductor system to which the electronic system shown in FIG. 18 may be applied.
Figure 20:
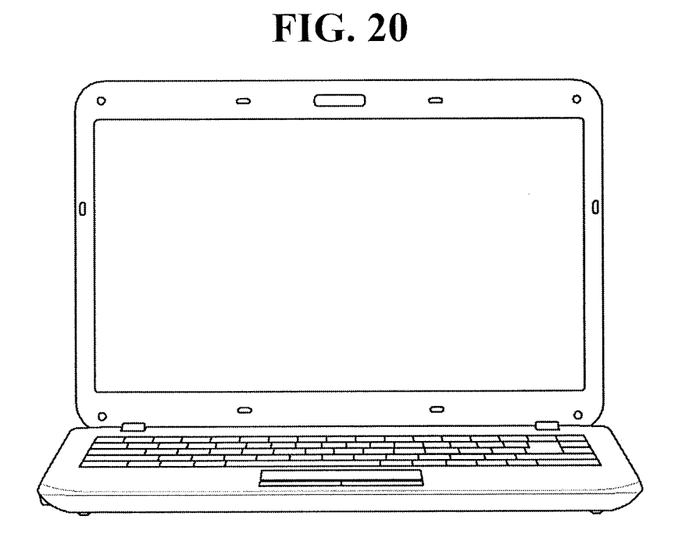

FIGS. 19 and 20 illustrate exemplary semiconductor system to which the electronic system shown in FIG. 18 can be applied. Specifically, FIG. 19 illustrates a tablet PC and FIG. 20 illustrates a notebook computer. At least one of the semiconductor devices according to some embodiments may be used in a tablet PC, a notebook computer, or the like. The semiconductor device according to some embodiments can be applied to other integrated circuit devices not illustrated herein.

By way of summation and review, as the thickness of a silicon oxide film typically used as a gate insulating film is reduced, the gate insulating film may have physical limitations with respect to electrical properties. Therefore, as a substitute for existing silicon films, research into a high-k dielectric films having a high dielectric constant has been conducted. The high-k dielectric film may reduce leakage current between a gate electrode and a channel region while maintaining a reduced thickness of an equivalent oxide film.

One of methods of forming the high-k dielectric film having a high dielectric constant involves increasing a dielectric constant of a gate insulation film by nitridating the gate insulation film. However, in a situation in which it is desired to remove the nitridated gate insulation film, a nitride-containing spacer adjacent to the gate insulation film may be damaged during removal of the gate insulation film. To avoid this, the etching selectivity of the gate insulation film with respect to the nitridated spacer may be increased. In this case, however, the gate insulation film may not be efficiently etched. The damaged spacer or the un-etched gate insulation film may adversely affect the reliability of the device to be formed.

In contrast, embodiments provide a method of fabricating a semiconductor device, by which the semiconductor device can be fabricated with reliability. According to embodiments, the removal process of the dummy gate insulation film may be separately performed through a first process to selectively remove nitrogen included in the dummy gate insulation film and a second process to remove the nitrogen-removed dummy gate insulation film, thereby completely removing the dummy gate insulation film 110 without causing damages to the spacer 130.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of fabricating a semiconductor device, the method comprising:
    providing a dummy gate insulation film formed on a substrate, the dummy gate insulation film including a first material and providing a spacer formed at least one side of the gate insulation film, the spacer including the first material;
    removing the first material included in the dummy gate insulation film by a first process;
    removing the dummy gate insulation film from which the first material has been removed by a second process different from the first process; and
    sequentially forming a gate insulation film and a gate electrode structure on the substrate.

2. The method as claimed in claim 1, wherein the first material includes nitrogen.

3. The method as claimed in claim 1, wherein the first process includes performing a plasma treatment on the dummy gate insulation film using a second material different from the first material.

4. The method as claimed in claim 3, wherein the second material includes oxygen.

5. The method as claimed in claim 3, wherein a bias voltage is applied to the substrate while the first process is performed.

6. The method as claimed in claim 1, wherein the first process includes dry-etching the dummy gate insulation film.

7. The method as claimed in claim 1, wherein the second process includes forming a by-product by allowing third and fourth materials different from the first and second materials to be absorbed into the dummy gate insulation film from which the first material has been removed, and removing the formed by-product.

8. The method as claimed in claim 7, wherein the second process is repeatedly performed a multiple number of times.

9. A method of fabricating a semiconductor device, the method comprising:
    providing a substrate including a first region and a second region;
    forming a first gate insulation film including a first material and a second material and forming a spacer on at least one side of the first gate insulation film in the first region and the second region, respectively;
    performing a removal process to selectively remove the first gate insulation film formed in the first region;
    forming a second gate insulation film made of a different material from the first gate insulation film in the first region and the second region; and
    forming a gate electrode structure on the second gate insulation film,
    wherein the removal process includes a first process that removes the first material included in the first gate insulation film formed in the first region, and a second process that removes the first gate insulation film from which the first material has been removed.

10. The method as claimed in claim 9, further comprising forming a sacrificial film covering a top surface of the first gate insulation film formed in the second region while exposing a top surface of the first gate insulation film formed in the first region, wherein the removal process is performed using the sacrificial film as a mask.

11. The method as claimed in claim 10, wherein the sacrificial film includes a silicon oxide film.

12. The method as claimed in claim 9, wherein:
    the spacer includes the first material,
    the first material includes nitrogen, and
    the second material includes oxygen.

13. The method as claimed in claim 9, wherein the first process includes removing the first material by injecting the second material into the first gate insulation film formed in the first region.

14. The method as claimed in claim 9, wherein a dielectric constant of the second gate insulation film is greater than that of the first gate insulation film.

15. The method as claimed in claim 9, wherein the first region includes a low voltage region and the second region includes a high voltage region.

16. A method of fabricating a semiconductor device, the method comprising:
    providing a dummy gate insulation film on a substrate and providing a spacer on at least one side of the gate insulation film, the dummy gate insulation film including a first material that is nitridated, and the spacer including a second material that is nitridated, the first material and the second material being the same or different;
    removing nitrogen from the first material included in the dummy gate insulation film by a first process;
    removing the first material from which nitrogen has been removed by a second process different from the first process such that the dummy gate insulation film is removed from the substrate; and
    sequentially forming a gate insulation film and a gate electrode structure on the substrate.

17. The method as claimed in claim 16, wherein removing nitrogen from the first material included in the dummy gate insulation film by the first process includes performing a plasma treatment on the dummy gate insulation film using oxygen gas.

18. The method as claimed in claim 16, wherein:
    the dummy gate insulation film extends horizontally on the substrate,
    the spacer extends vertically from the substrate at the at least one side of the dummy gate insulation film, and
    a bias voltage is applied to the substrate while the first process is performed such that nitrogen is selectively removed from the dummy gate insulation film.

19. The method as claimed in claim 16, wherein removing nitrogen from the first material included in the dummy gate insulation film by the first process includes dry-etching the dummy gate insulation film using an etchant that reacts with nitrogen.

20. The method as claimed in claim 1, wherein the second process includes forming a by-product by absorbing HF and NH$_3$ into the dummy gate insulation film from which nitrogen has been removed, and removing the formed by-product.

* * * * *